United States Patent
Zhang et al.

(10) Patent No.: US 10,985,064 B2
(45) Date of Patent: Apr. 20, 2021

(54) BURIED POWER AND GROUND IN STACKED VERTICAL TRANSPORT FIELD EFFECT TRANSISTORS

(71) Applicant: International Business Machines Corporation, Armonk, NY (US)

(72) Inventors: Chen Zhang, Guilderland, NY (US); Heng Wu, Guilderland, NY (US); Kangguo Cheng, Schenectady, NY (US); Tenko Yamashita, Schenectady, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/425,133

(22) Filed: May 29, 2019

(65) Prior Publication Data

US 2020/0381300 A1  Dec. 3, 2020

(51) Int. Cl.
*H01L 21/768* (2006.01)
*H01L 21/84* (2006.01)
*H01L 23/48* (2006.01)
*H01L 27/12* (2006.01)

(52) U.S. Cl.
CPC .. *H01L 21/76898* (2013.01); *H01L 21/76816* (2013.01); *H01L 21/84* (2013.01); *H01L 23/481* (2013.01); *H01L 27/1207* (2013.01)

(58) Field of Classification Search
CPC ............... H01L 21/76898; H01L 21/84; H01L 27/1207
See application file for complete search history.

(56) References Cited

U.S. PATENT DOCUMENTS

| | | | |
|---|---|---|---|
| 6,424,007 B1 | 7/2002 | Disney | |
| 6,770,534 B2 | 8/2004 | Cho et al. | |
| 7,683,428 B2 | 3/2010 | Chidambarrao et al. | |
| 9,824,933 B1 | 11/2017 | Pawlak | |
| 9,997,413 B1 | 6/2018 | Leobandung | |
| 10,002,803 B2 | 6/2018 | Cheng et al. | |
| 2006/0261406 A1 | 11/2006 | Chen | |
| 2017/0243745 A1 | 8/2017 | Yilmaz | |
| 2018/0090388 A1* | 3/2018 | Anderson | H01L 29/78642 |
| 2018/0130900 A1 | 5/2018 | Usami | |
| 2018/0197787 A1 | 7/2018 | Anderson | |
| 2019/0355830 A1* | 11/2019 | Balakrishnan | H01L 29/0847 |

* cited by examiner

*Primary Examiner* — Hsien Ming Lee
(74) *Attorney, Agent, or Firm* — Fleit Intellectual Property Law; Thomas S. Grzesik

(57) ABSTRACT

A stacked semiconductor device structure and method for fabricating the same. The stacked semiconductor device structure includes a first vertical transport field effect transistor (VTFET) and a second VTFET stacked on the first VTFET. The structure further includes at least one power line and at least one ground line disposed within a backside of the stacked semiconductor structure. The method includes at least orientating a structure including a first VTFET and a second VTFET stacked on the first VTFET such that a multi-layer substrate, on which the first VTFET is formed, is above the first and second VTFETs. First and second contact trenches are formed through at least one layer of the multi-layer substrate. The first contact trench exposes a portion of a metal contact and the second contact trench exposes a portion of a source/drain region. The first and second contact trenches are filled with a contact material.

19 Claims, 15 Drawing Sheets

US 10,985,064 B2

BURIED POWER AND GROUND IN STACKED VERTICAL TRANSPORT FIELD EFFECT TRANSISTORS

BACKGROUND OF THE INVENTION

The present invention generally relates to the field of semiconductors, and more particularly relates to vertical transport field effect transistors.

Vertical transport field effect transistors (VTFETs or VFETs) are becoming viable device options for semiconductor devices, for example, complementary metal oxide semiconductor (CMOS) devices, beyond 5 nanometer (nm) node. VFET devices include fin channels with source/drain regions at ends of the fin channels on top and bottom sides of the fins. Current runs through the fin channels in a vertical direction (e.g., perpendicular to a substrate), for example, from a bottom source/drain region to a top source/drain region. Vertical transport architecture devices are designed to extend the product value proposition beyond conventional plateaus and address the limitations of horizontal device architectures by, for example, decoupling of gate length from the contact gate pitch. Vertical transistors may provide higher density scaling and allow for relaxed gate lengths to better control device electrostatics, without sacrificing the gate contact pitch size.

SUMMARY OF THE INVENTION

In one embodiment, a method for forming a semiconductor structure comprises at least orientating a structure including a first vertical transport field effect transistor (VTFET) and a second VTFET stacked on the first VTFET such that a multi-layer substrate, on which the first VTFET is formed, is above the first and second VTFETs. A first contact trench and a second contact trench are formed through at least one layer of the multi-layer substrate. The first contact trench exposes a portion of a metal contact that is in contact with a source/drain region of one of the first VTFET or the second VTFET. The second contact trench exposes a portion of a source/drain region of a different one of the first VTFET or the second VTFET. The first and second contact trenches are filled with a contact material.

In another embodiment, a stacked semiconductor device structure comprises a first vertical transport field effect transistor (VTFET) and a second VTFET stacked on the first VTFET. The stacked semiconductor device structure further comprises at least one power line and at least one ground line disposed within a backside of the stacked semiconductor device structure.

In a further embodiment, an integrated circuit comprises a stacked vertical transport field effect transistor (VTFET) device. The stacked VTFET device comprises a first VTFET a second VTFET stacked on the first VTFET. The stacked VTFET device further comprises at least one power line and at least one ground line disposed within a backside of the stacked semiconductor device structure.

BRIEF DESCRIPTION OF THE DRAWINGS

The accompanying figures where like reference numerals refer to identical or functionally similar elements throughout the separate views, and which together with the detailed description below are incorporated in and form part of the specification, serve to further illustrate various embodiments and to explain various principles and advantages all in accordance with the present invention, in which.

DETAILED DESCRIPTION

Figure 1:
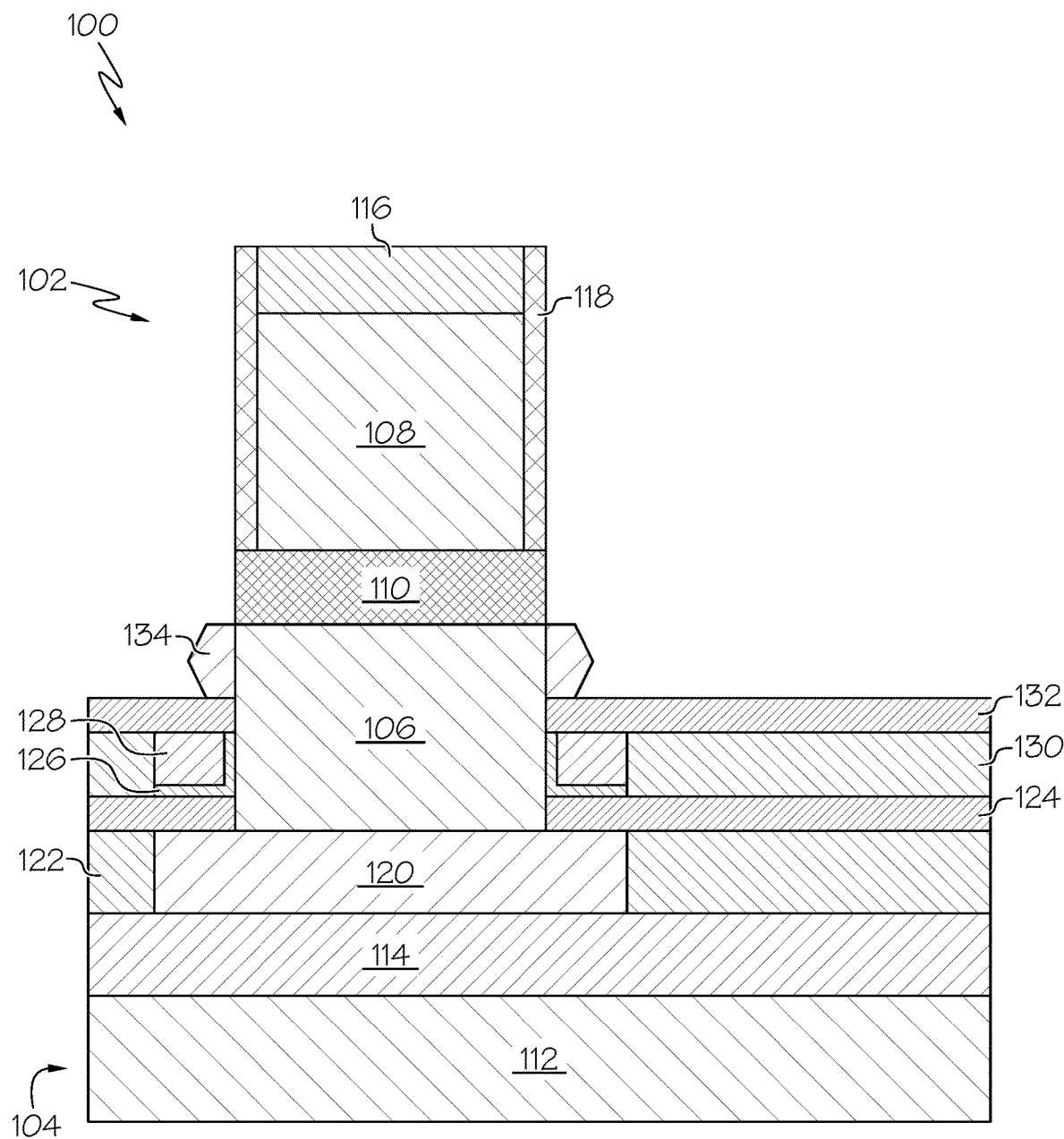
FIG. 1 is a cross-sectional view of a semiconductor device structure after a bottom VTFET has been formed according to one embodiment of the present invention.

It is to be understood that the present invention will be described in terms of a given illustrative architecture; however, other architectures, structures, substrate materials and process features and steps may be varied within the scope of the present invention.

It will also be understood that when an element such as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

The present invention may include a design for an integrated circuit chip, which may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher-level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

It is to be understood that the various layers and/or regions shown in the accompanying drawings are not drawn to scale, and that one or more layers and/or regions of a type commonly used in complementary metal-oxide semiconductor (CMOS), field-effect transistor (FET), fin field-effect transistor (finFET), metal-oxide-semiconductor field-effect transistor (MOSFET), and/or other semiconductor devices may not be explicitly shown in a given drawing. This does not imply that the layers and/or regions not explicitly shown are omitted from the actual devices. In addition, certain elements may be left out of particular views for the sake of clarity and/or simplicity when explanations are not necessarily focused on the omitted elements. Moreover, the same or similar reference numbers used throughout the drawings are used to denote the same or similar features, elements, or structures, and thus, a detailed explanation of the same or similar features, elements, or structures will not be repeated for each of the drawings.

Deposition may be any process that grows, coats, or otherwise transfers a material onto the wafer. Available technologies include physical vapor deposition (PVD), chemical vapor deposition (CVD), plasma-enhanced chemical vapor deposition (PECVD), electrochemical deposition (ECD), molecular beam epitaxy (MBE) and more recently, atomic layer deposition (ALD) among others.

Removal may be any process that removes material from the wafer; examples include etch processes (either wet or dry) and chemical-mechanical planarization (CMP).

Patterning refers to the shaping or altering of deposited materials, and is generally referred to as lithography. For example, in conventional lithography, the wafer is coated with a chemical called a photoresist; then, a machine called a stepper focuses, aligns, and moves a mask, exposing select portions of the wafer below to short wavelength light; the exposed regions are washed away by a developer solution. After etching or other processing, the remaining photoresist is removed by plasma ashing.

Modification of electrical properties has historically entailed doping transistor sources and drains (originally by diffusion furnaces and later by ion implantation). These doping processes are followed by furnace annealing or, in advanced devices, by rapid thermal annealing (RTA); annealing serves to activate the implanted dopants. Modification of electrical properties now also extends to the reduction of a material's dielectric constant in low-k insulators trench exposure to ultraviolet light in UV processing (UVP). Modification is frequently achieved by oxidation, which can be carried out to create semiconductor-insulator junctions, such as in the local oxidation of silicon (LOCOS) to fabricate metal oxide field effect transistors.

A field-effect transistor (FET) is a transistor having a source, a gate, and a drain, and having action that depends on the flow of carriers (electrons or holes) along a channel that runs between the source and drain. Current through the channel between the source and drain may be controlled by a transverse electric field under the gate. FETs are widely used for switching, amplification, filtering, and other tasks. FETs include metal-oxide-semiconductor (MOS) FETs (MOSFETs). Complementary MOS (CMOS) devices are widely used, where both n-type and p-type transistors (nFET and pFET) are used to fabricate logic and other circuitry. Source and drain regions of a FET are typically formed by adding dopants to target regions of a semiconductor body on either side of a channel, with the gate being formed above the channel. The gate includes a gate dielectric over the channel and a gate conductor over the gate dielectric. The gate dielectric is an insulator material that prevents large leakage current from flowing into the channel when voltage is applied to the gate conductor while allowing applied gate voltage to produce a transverse electric field in the channel.

Increasing demand for high density and performance in integrated circuit devices requires development of new structural and design features, including shrinking gate lengths and other reductions in size or scaling of devices. Continued scaling, however, is reaching limits of conventional fabrication techniques.

Stacking FETs in a vertical direction gives an additional dimension for CMOS area scaling. It is difficult, however, to stack planar FETs. Vertical transport FETs (VTFETs) are being pursued as viable CMOS architectures for scaling to 5 nanometers (nm) and beyond. VTFETs provide the opportunity for further device scaling compared with other device architectures. VTFETs have various potential advantages over other conventional structures such as fin field-effect transistors (FinFETs). Such advantages may include improvements in density, performance, power consumption, and integration.

Stacking VTFETs may provide further advantages in reducing the area and enabling a denser circuit layout where low-track cell design is possible. An intrinsic problem of low-track logic cell is the wire-ability. As the ground and power rails occupy a large amount of space, there is generally not much room for routing the input and output wires. One or more embodiments overcome these and other problems by fabricating and disposing the ground and power lines in the backside of the devices as will be discussed in further detail below.

FIGS. 1-14 illustrate various processes for forming power and ground lines within the backside of stacked VTFETs according to various embodiments of the present invention. FIG. 1 shows a cross-sectional view of a semiconductor device structure 100. The semiconductor device structure 100 may comprise one or more stacked VTFET structures 102 at an intermediate stage of fabrication. The VTFET structure(s) 102 may comprise a substrate 104 and vertical fins 106, 108 formed over the substrate 104. The vertical fins 106, 108 of each stacked VTFET structure 102 may be separated by an isolation layer 110. The vertical fins 106, 108 may provide vertical transport channels for respective VTFETs. The vertical fin 106 may provide a vertical transport channel for a "lower" VTFET and the vertical fin 108 may provide a vertical transport channel for an "upper" VTFET.

In some embodiments, the vertical 106, 108 may provide vertical transport channels for a same type of VTFET (e.g., one of nFETs and pFETs). In other embodiments, different ones of the vertical fins 106, 108 provide vertical transport channels for different types of VTFETs. For example, the vertical fins 106, 108 may provide vertical transport channels for one of nFET and pFET VTFETs, while vertical fins of another VTFET structure (not shown) may provide vertical transport channel for the other one of nFET and pFET VTFETs. As another example, the vertical fin 106 (e.g., for the "lower" VTFET) may provide vertical transport channels for one of nFET and pFET VTFETs while the vertical fin 108 (e.g., for the "upper" VTFET) may provide vertical transport channels for the other one of nFET and pFET VTFETs. Various other combinations are possible.

As illustrated in FIG. 1, the vertical fin 106 may have a first, wider thickness for the lower VTFET and the vertical fin 108 may have a second, narrower thickness for the upper VTFET. In some embodiments the horizontal width or thickness of the vertical fin 106 for the lower VTFETs may be in the range of 5 to 12 nm and the horizontal width or thickness of the vertical fin 108 for the upper VTFET may be in the range of 4 to 10 nm, although other dimensions are applicable as well. The height or vertical thickness of the vertical fin 106 (as measured from a top surface of the substrate 104) may be in the range of 30 to 70 nm, although other dimensions are applicable as well. The height or vertical thickness of the vertical fin 108 (as measured from a top surface of the isolation layers 110) may be in the range of 30 to 70 nm, although other dimensions are applicable as well.

The substrate 104 and vertical fins 106, 108 may be formed of any suitable semiconductor structure, including various silicon-containing materials including but not limited to silicon (Si), silicon germanium (SiGe), silicon germanium carbide (SiGeC), silicon carbide (SiC) and multi-layers thereof. Although silicon is the predominantly used semiconductor material in wafer fabrication, alternative semiconductor materials can be employed as additional layers, such as, but not limited to, germanium (Ge), gallium arsenide (GaAs), gallium nitride (GaN), SiGe, cadmium telluride (CdTe), zinc selenide (ZnSe), etc.

In one or more embodiments, the substrate 104 may be multi-layer substrate such as a silicon-on-insulator (SOI) substrate. The SOI substrate may comprise a substrate layer 112 comprising, for example, silicon (Si); a buried oxide (BOX) layer 114 comprising, for example, $SiO_2$; and a semiconductor (SOI) layer (shown as patterned bottom fin 106) comprising, for example, Si, SiGe, SiGeC, SiC, and/or multi-layers thereof. It should be noted that the layers of the SOI substrate are not limited to these materials and other materials are applicable as well. It should also be noted that embodiments are not limited to an SOI substrate as other substrates are applicable as well.

The starting structure may comprise the SOI substrate; the isolation layer 110 formed on the semiconductor (SOI) layer of the SOI substrate; and one or more additional semiconductor layers that provides material for the upper vertical fin 108. The vertical fins 106, 108 may be formed using sidewall image transfer (SIT) or other suitable techniques such as lithography and etching including reactive-ion etching (RIE), etc. This may involve patterning a hard mask layer (e.g., formed of a nitride such as silicon nitride (SiN)) over the additional semiconductor layer to form a hardmask layer 116 and then etching down to the isolation layer material to form the upper vertical fin 108. A sidewall spacer 118 may then be formed using conventional techniques.

Further etching is performed using the hardmask layer 116 and sidewall spacer 118 as a pattern to etch down the isolation layer material and semiconductor layer (SOI) of the SOI substrate to form the lower vertical fin 108 on the BOX layer 114. In other embodiments, the lower vertical fin 106 may be formed first, followed by deposition of the isolation layer material and then subsequent formation of the upper vertical fin 108. The isolation layer 110 may be formed of an insulating material such as silicon dioxide ($SiO_2$), SiN, silicon oxycarbide (SiOC), etc. The isolation layer 110 may have a height or vertical thickness in the range of 10 to 20 nm, although other dimensions are applicable as well.

Although FIG. 1 shows an example where just one set of vertical fins are formed, it should be appreciated that more or fewer than two sets of vertical fins may be formed depending on the desired number of VTFETs for the resulting structure. In addition, while FIG. 1 illustrates stacking just two VTFETs, it should be appreciated that three or more VTFETs may be stacked on top of one another.

The VTFET structure 102 at the intermediate stage of fabrication may further include bottom source/drain region 120 for the lower VTFET. The bottom source/drain region 120 may be disposed below a top portions of the lower vertical fin 106 as illustrated. The bottom source/drain region 120 may either be a source layer or a drain layer and formed in contact with an exposed lower portion of the lower vertical fin 106. The bottom source/drain region 120 may have a height or vertical thickness in the range of 15 to 30 nm and a width or horizontal thickness in the range of 40 to 60 nm, although other dimensions are applicable as well.

The bottom source/drain region 120 may be formed, for example, by implantation of a suitable dopant, such as using ion implantation, gas phase doping, plasma doping, plasma immersion ion implantation, cluster doping, infusion doping, liquid phase doping, solid phase doping, etc. N-type dopants may be selected from a group of phosphorus (P), arsenic (As) and antimony (Sb), and p-type dopants may be selected from a group of boron (B), boron fluoride ($BF_2$), gallium (Ga), indium (In), and thallium (Tl).

A single (merged) bottom source/drain region 120 may be formed for multiple fins or a separate bottom source/drain region 120 may be formed for each fin. Example materials for the first bottom source/drain region 120 include (but are not limited to) phosphorus doped silicon epitaxy for an nFET device and boron doped silicon germanium epitaxy for a pFET device. The first bottom source/drain region 120 may comprise the same or different material than the material that provides the lower fin 106.

The bottom source/drain regions region 120 may also be formed by an epitaxial growth process. In some embodiments, the epitaxy process comprises in-situ doping (dopants are incorporated in epitaxy material during epitaxy). Epitaxial materials may be grown from gaseous or liquid precursors. Epitaxial materials may be grown using vapor-phase epitaxy (VPE), molecular-beam epitaxy (MBE), liquid-phase epitaxy (LPE), rapid thermal chemical vapor deposition (RTCVD), metal organic chemical vapor deposition (MOCVD), ultra-high vacuum chemical vapor deposition (UHVCVD), low-pressure chemical vapor deposition (LPCVD), limited reaction processing CVD (LRPCVD), or other suitable processes. Epitaxial silicon, silicon germanium (SiGe), germanium (Ge), and/or carbon doped silicon (Si:C) silicon can be doped during deposition (in-situ doped) by adding dopants, such as n-type dopants (e.g., phosphorus or arsenic) or p-type dopants (e.g., boron or gallium), depending on the type of transistor. The dopant concentration may range from $1 \times 10^{19}$ $cm^{-3}$ to $3 \times 10^{21}$ $cm^{-3}$, (e.g., between $2 \times 10^{20}$ $cm^{-3}$ to $3 \times 10^{21}$ $cm^{-3}$), although other concentrations are applicable as well.

The bottom/source drain region 120 may be surrounded by a shallow trench isolation (STI) layer 122. The STI layer 122 may have a height or vertical thickness in the range of 50 to 400 nm, although other dimensions are applicable as well. A bottom spacer 124 for the lower VTFET may be formed surrounding and in contact with a portion of the lower vertical fin 106. The bottom spacer 124 may further be formed above and in contact with bottom source/drain region 120 and the STI layer 122. The bottom spacer 124 may be formed using various processing, such as non-conformal deposition and etch-back processing (e.g., physical vapor deposition (PVD), high density plasma (HDP) deposition, etc.). The bottom spacer 124 may be formed of a dielectric material such as $SiO_2$, SiN, silicon carbide oxide (SiCO), silicon boron carbide nitride (SiBCN), etc. The bottom spacer 124 may have a height or vertical thickness in the range of 3 to 10 nm, although other dimensions are applicable as well.

Above the bottom spacer 124, a gate stack for the lower VTFET may be formed. The gate stack may comprise gate dielectric layer 126 and gate conductor layer 128. The gate dielectric layer 126 may be formed of a high-k dielectric material. Examples of high-k materials include but are not limited to metal oxides such as hafnium oxide ($HfO_2$), hafnium silicon oxide (Hf—Si—O), hafnium silicon oxynitride (HfSiON), lanthanum oxide ($La_2O_3$), lanthanum aluminum oxide ($LaAlO_3$), zirconium oxide ($ZrO_2$), zirconium silicon oxide, zirconium silicon oxynitride, tantalum oxide ($Ta_2O_5$), titanium oxide ($TiO_2$), barium strontium titanium oxide, barium titanium oxide, strontium titanium oxide, yttrium oxide ($Y_2O_3$), aluminum oxide ($Al_2O_3$), lead scandium tantalum oxide, and lead zinc niobate. The high-k material may further include dopants such as lanthanum (La), aluminum (Al), and magnesium (Mg). The gate dielectric layer 126 may have a uniform thickness in the range of 1 nm to 3 nm, although other dimensions are applicable as well.

The gate conductor layer 128 may include a metal gate or work function metal (WFM). In some embodiments, the gate conductor layer 128 may be formed using atomic layer deposition (ALD) or another suitable process. For nFET devices, the WFM for the gate conductor may be titanium (Ti), aluminum (Al), titanium aluminum (TiAl), titanium aluminum carbon (TiAlC), a combination of Ti and Al alloys, a stack which includes a barrier layer (e.g., of titanium nitride (TiN) or another suitable material) followed by one or more of the aforementioned WFM materials, etc. For pFET devices, the WFM for the gate conductor may be TiN, tantalum nitride (TaN), or another suitable material. In some embodiments, the pFET WFM may include a metal stack, where a thicker barrier layer (e.g., of TiN, TaN, etc.) is formed followed by a WFM such as Ti, Al, TiAl, TiAlC, or any combination of Ti and Al alloys. It should be appreciated that various other materials may be used for the gate conductor as desired. The gate conductor layer 128 may have a horizontal width or thickness in the range of 5 to 20 nm, although other dimensions are applicable as well. The gate stack (e.g., the gate dielectric layer 126 and gate conductor layer 128) may collectively have a height or vertical thickness in the range of 10 to 30 nm on vertical sidewalls of the lower vertical fin 106 although other dimensions are applicable as well.

An interlayer dielectric (ILD) 130 may then formed surrounding the gate stack for the lower VTFETs. The ILD 130 may be formed of any suitable isolation material, such as $SiO_2$, SiOC, SiON, etc. A top spacer 132 for the lower VTFETs may be formed surrounding and contacting a portion of the vertical sidewalls of the lower vertical fin 106. The top spacer 132 may further be formed on and in contact with the gate stacks and the ILD 130. The top spacer 132 may be formed of similar materials and with similar sizing as that discussed above with respect to bottom spacer 124.

A top source/drain region 134 of the lower VTFET may be formed on and in contact with the top spacer 132 and surrounding and contacting the remaining portion of the vertical sidewalls of the lower vertical fin 106. The top source/drain 134 may be formed of similar materials and with similar processing as that discussed above with respect to bottom source/drain region 120. The top source/drain region 134 may either be a source layer or a drain layer. The top source/drain region 134 may have a height or vertical thickness in the range of 10 to 30 nm and may have a width or horizontal thickness in the range of 5 to 15 nm, although other dimensions are applicable as well.

Figure 2:
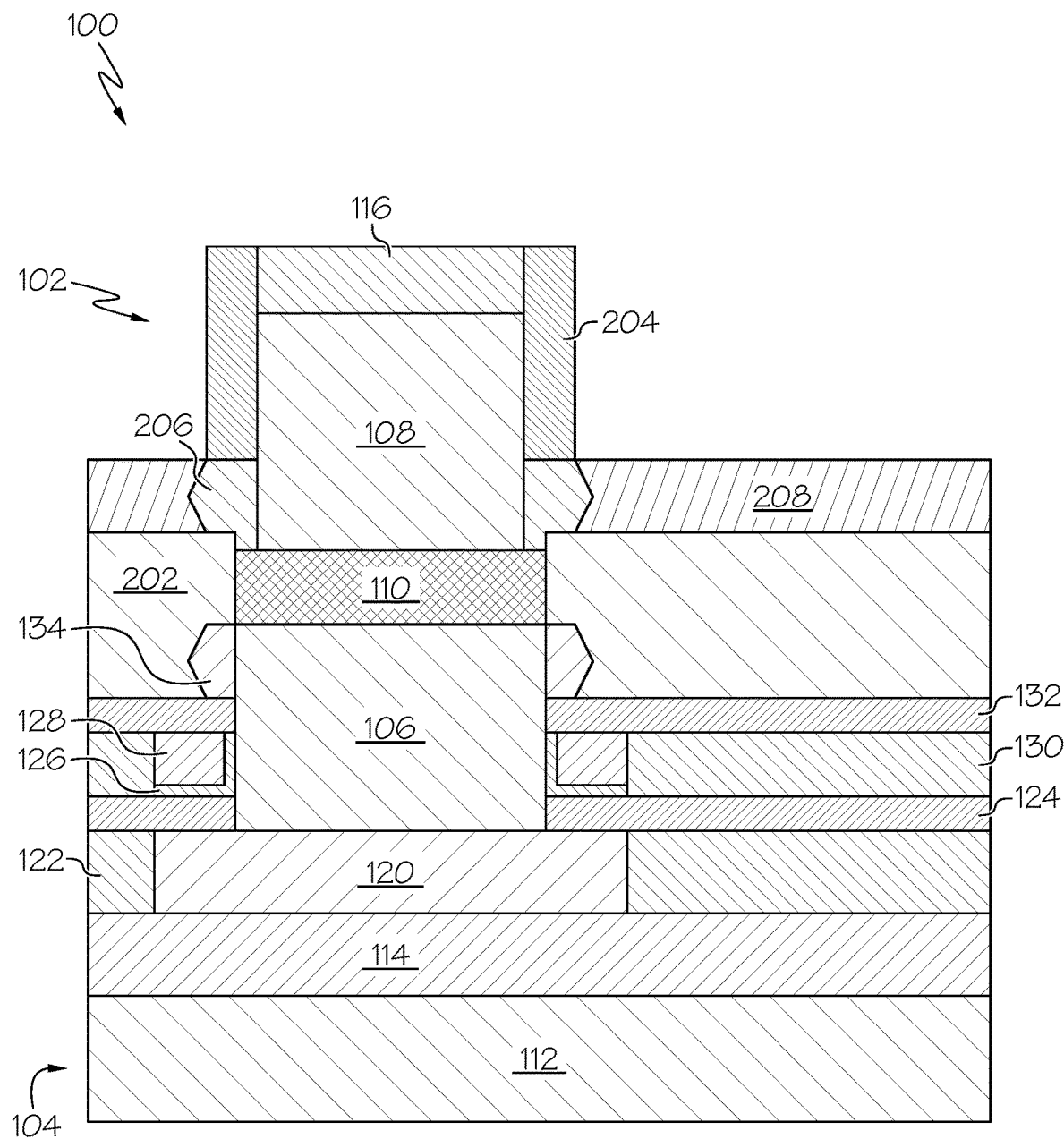
FIG. 2 is a cross-sectional view of the semiconductor device structure after a sacrificial layer has been formed in contact with a bottom source/drain region of an upper VTFET that is stack on the first VTFET according to one embodiment of the present invention.

FIG. 2 shows a cross-sectional view of the structure of FIG. 1 after formation of an ILD 202 surrounding and in contact with the top source/drain region 134 and further contacting sidewalls of the insulating layer 110 and a top surface of the top spacer 132; the removal of sidewall spacer 118 (FIG. 1); the formation of a temporary oxide layer (not shown) on the ILD layer 202 adjacent the upper vertical fin 108; the formation of a sidewall spacer 204 on the vertical surfaces of the upper vertical fin 108 above the temporary oxide layer; the removal of the temporary oxide layer; the formation of a bottom source/drain region 206 over and in contact with the ILD layer 202 and further in contact with a portion of the upper vertical fin 108 exposed by removal of the temporary oxide layer; and the formation of a sacrificial layer 208 on and in contact with the ILD layer 202 and further in contact with and adjacent to at least a portion of the bottom source/drain region 206.

The ILD layer 202 may be formed of similar materials and in a similar manner as discussed above with respect to ILD 130, and may have a height or vertical thickness in the range of 20 to 40 nm, although other dimensions are applicable as well. The temporary oxide layer (not shown) may be formed using well known materials and techniques. For example, the temporary oxide layer may be deposited using any of the above described deposition techniques to a predetermined thickness.

A dielectric layer may be deposited on the exposed surfaces of the upper vertical fin 108, the hardmask layer 116, and the temporary oxide layer so that portions of the dielectric layer may be removed to form sidewall spacer 204 from the material remaining on the vertical surfaces of the upper vertical fin 108 and the hard mask layer 116. For example, horizontal portions of the dielectric layer may be removed in an RIE process. The RIE process can be performed using, for example, $CH_4$, $CHF_3$, or $CH_2F_2$ chemistry. In one embodiment, the dielectric layer may comprise, for example, SiN, silicon boron nitride (SiBN), siliconborocarbonitride (SiBCN) or some other dielectric, and has a thickness of about 2 nm to about 10 nm although other dimensions are applicable as well. The temporary oxide layer may then be removed, for example, using an etching process selective to the sidewall spacer 204, hard mask layer 116, and ILD layer 202 to expose the surface of the ILD layer 202 and portions of the vertical sidewalls of the upper vertical fin 108.

The bottom source/drain region 206 may be may either be a source layer or a drain layer and formed over the ILD layer 202 surrounding and contacting the portions of the vertical sidewall of the upper vertical fins 108 The bottom source/drain region 206 may be formed of similar materials and with similar processing as that discussed above with respect to bottom source/drain region 120. The bottom source/drain region 206 may have a height or vertical thickness in the range of 10 to 30 nm and may have a width or horizontal thickness in the range of 5 to 15 nm, although other dimensions are applicable as well.

Sacrificial layer 208 may formed over the ILD layer 202 adjacent to and contacting at least a portion of the bottom source/drain region 206. The sacrificial material of the sacrificial layer 208 may comprise a material that may be etched selective to silicon and nitride materials. For example, the sacrificial material of the sacrificial layer 208 may comprise a material such as, e.g., a silicon oxide, a silicon germanium alloy, an amorphous germanium, or other material that may be etched selective to silicon and nitride materials. The sacrificial layer 208 may be formed, for example, by depositing a sacrificial material across the structure using a directional deposition technique such as, e.g., a physical vapor deposition (PVD) process, a high density plasma (HDP) chemical vapor deposition (CVD) process (HDPCVD), or other similar processes.

In one embodiment, the parameters of the HDP deposition are tuned to achieve a directional deposition of sacrificial material wherein the deposition rate of the sacrificial material on horizontal surfaces is greater than the deposition rate of sacrificial material on vertical surfaces. An etch back process is performed to remove sacrificial material on the vertical surfaces. By way of example only, a HDPCVD or physical vapor deposition (PVD) process may be used for directional film deposition, and an isotropic etch that is selective to the sacrificial material can be used to remove the (thinner) sacrificial material that is deposited on the vertical surfaces. The sacrificial layer 208 may have a thickness similar to that of bottom source/drain region 206. It should be noted that a similar sacrificial may alternatively be formed on the top spacer 132 and the top source/drain region 134 of the bottom/lower vertical fin 106, or the BOX layer 114 and the bottom source/drain region 120 of the lower vertical fin 160.

Figure 3:
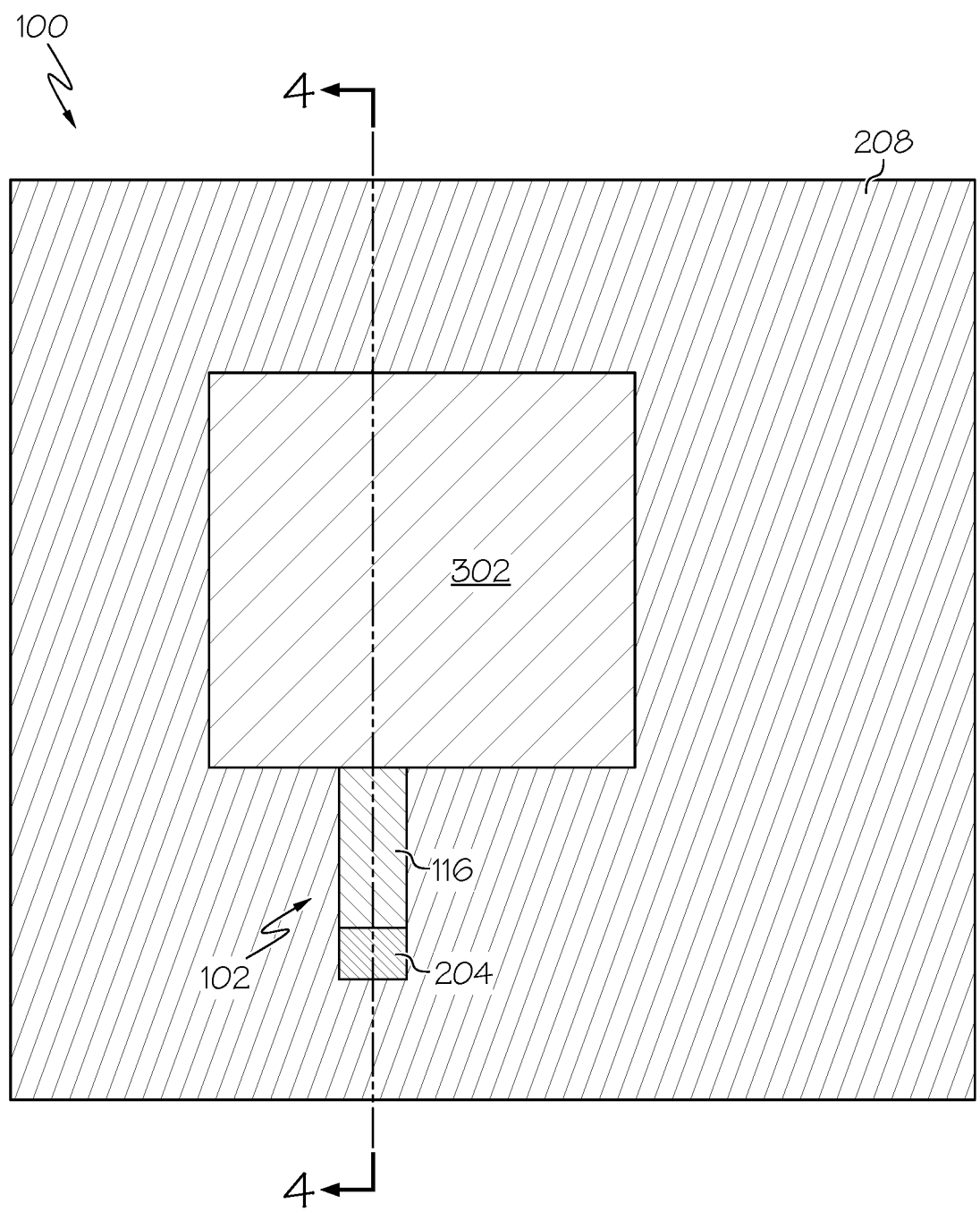
FIG. 3 is a top-down view of the semiconductor device structure after a planarization layer has been formed and pattern over areas of the sacrificial layer according to one embodiment of the present invention.
Figure 4:
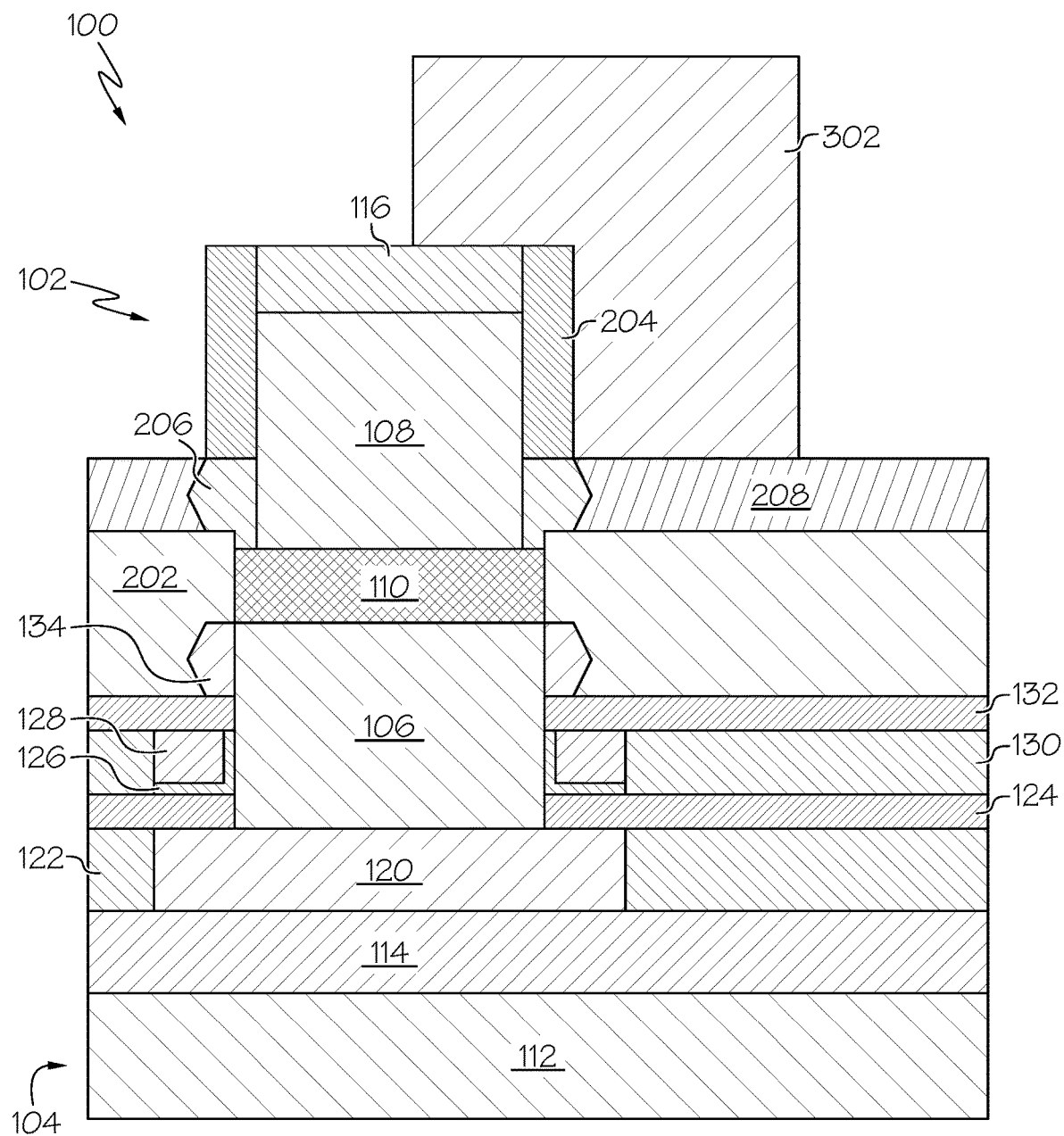
FIG. 4 is a cross-sectional view of the semiconductor device structure after a planarization layer has been formed and pattern over areas of the sacrificial layer according to one embodiment of the present invention.

FIG. 3 shows a top-down view and FIG. 4 shows a cross-sectional view of the structure of FIG. 2 following formation of an organic planarization layer (OPL) 302 on the sacrificial layer 208. The OPL 302 may be formed over the sacrificial layer 208 using known organic materials and techniques. For example, the OPL 302 may comprise a resin material that is applied by spin coating and baked to enhance planarization. In some embodiments, the OPL 302 may comprise a liquid monomer that is applied by spin coating and photochemically hardened. The OPL 302 may be patterned using lithographic techniques. In some embodiments, the OPL 302 may be patterned to form an etch mask over a portion of the fin 108 but not on other portions of the fin 108. In one or more embodiments, the OPL 302 may be patterned into rectangular shapes that are transferred to the sacrificial layer 208. The rectangular shape provides an ease of use in lithographic patterning and a simplicity in the masking process.

Figure 5:
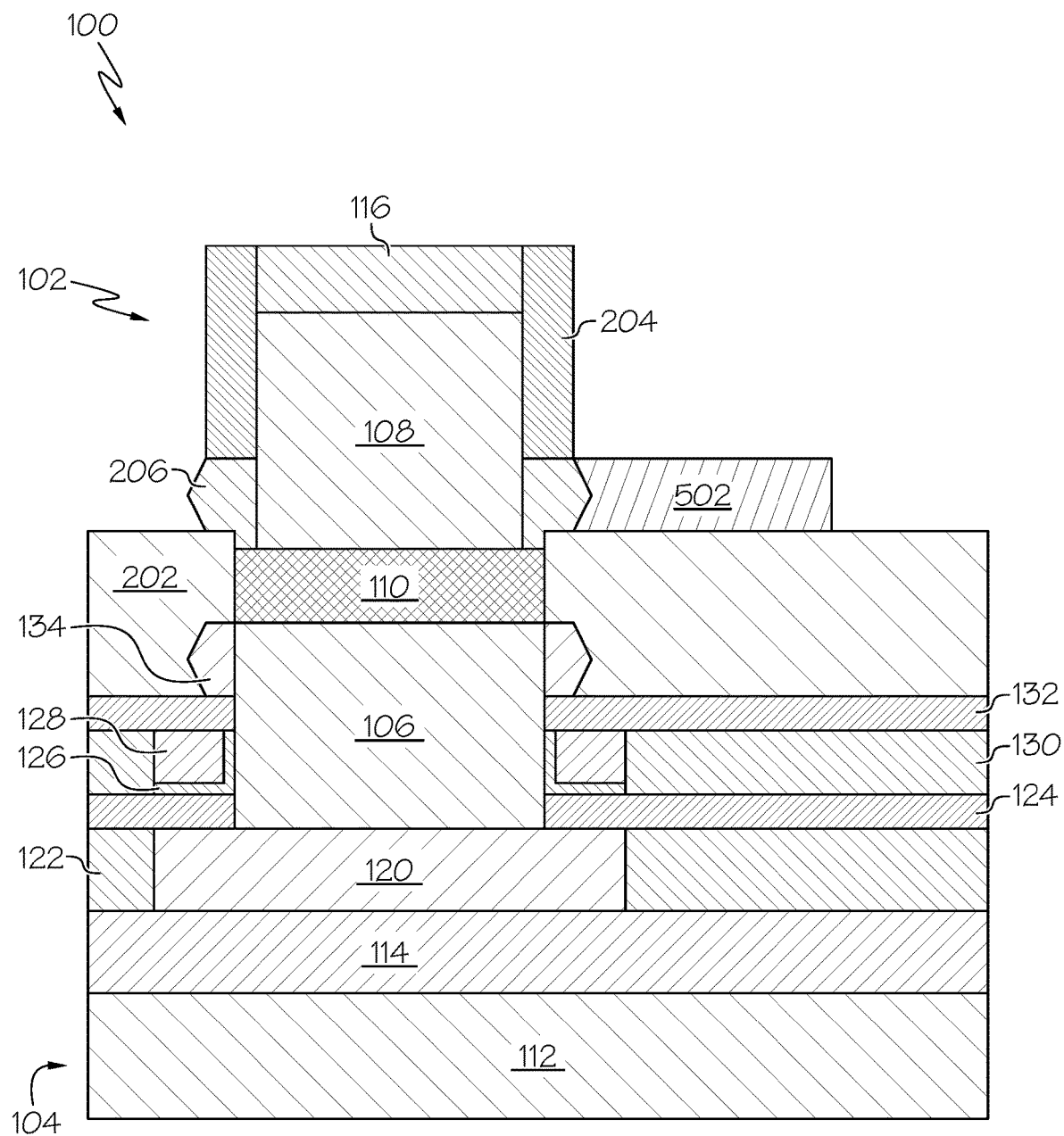
FIG. 5 is a cross-sectional view of the semiconductor device structure after the sacrificial layer has been patterned according to one embodiment of the present invention.

FIG. 5 shows a cross-sectional view of the structure of FIGS. 3 and 4 following an etching process that has etched the exposed portions of sacrificial layer 208 according to the etch mask pattern of OPL 302 to form one or more patterned sacrificial layers 502 and removal of the OPL 302. The etching process may be selective to the OPL 302, bottom source/drain region 206, and the ILD 202. As will be discussed in further detail below, the sacrificial layer(s) 502 may be removed during later processing to form a contact to the bottom source/drain region 206.

Figure 6:
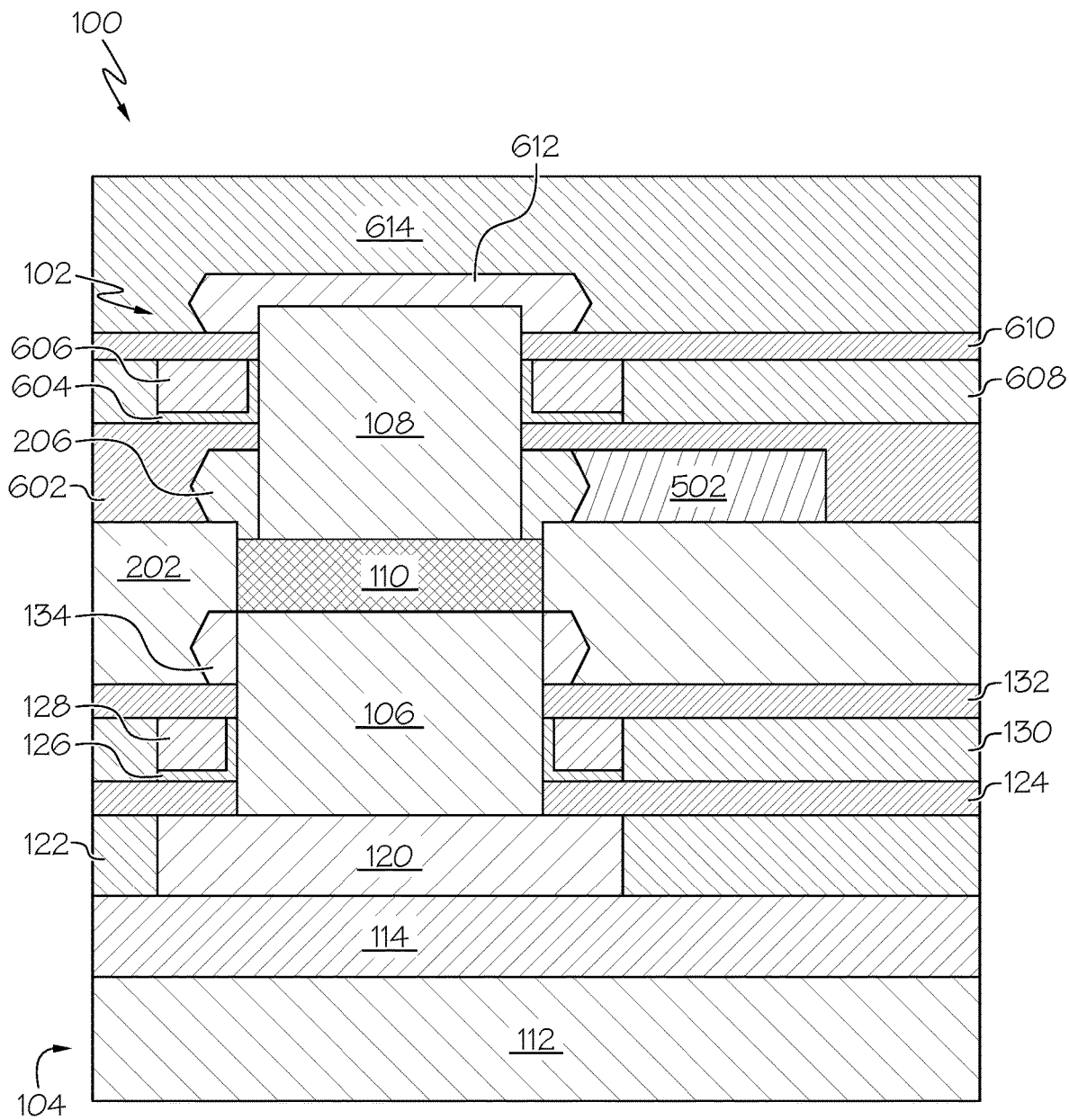
FIG. 6 is a cross-sectional view of the semiconductor device structure after the upper VTFET has been formed and an interlayer dielectric has been formed thereon according to one embodiment of the present invention.

FIG. 6 shows a cross-sectional view of the structure of FIG. 5 after removal of sidewall spacer 204, removal of the hard mask layer 116, formation of a bottom spacer 602, gate stack comprising a dielectric layer 604 and gate conductor layer 606, an ILD 608, a top spacer 610, a top source/drain region 612, and an additional ILD 614. The sidewall spacer 204 and hardmask layer 114 may be remove using a planarizing process such as, e.g., CMP, or a selective etching process that is selective to the ILD layer 202, bottom source/drain regions 206, and sacrificial layer 502.

The bottom spacer 602 may be formed surrounding and in contact with the bottom source/drain region 206 and further formed in contact with a top surface of the ILD 202 and a portion of the vertical sidewalls of the upper vertical fin 108. The bottom spacer 602 may be formed of similar materials as the bottom spacer 124 of the lower VTFET. The bottom spacer 602 may have a height or vertical thickness in the range of 10 to 30 nm (although other dimensions are applicable as well). The bottom spacer 602 may be formed with a greater height than that of the bottom source/drain region 206 so as to provide a buffer between the bottom source/drain region 206 and the gate stack of the upper VTFET.

The gate stack for the upper VTFET may be formed surrounding and in contact with a portion of the vertical sidewalls of the upper vertical fin 108 and further in contact with a top surface of the bottom spacer 602. The gate stack for the upper VTFET, similar to the gate stack for the lower VTFET, may include a gate dielectric layer 604 and a gate conductor layer 606. The gate dielectric layer 604 and gate conductor layer 606 may be formed of similar materials, with similar processing and similar sizing as that discussed above with respect to the gate dielectric layer 126 and gate conductor layer 128 of the lower VTFET.

Although not shown, an interfacial layer may be formed between the gate stacks and the sidewalls of each vertical fin 106, 108. The interfacial layer may be formed of SiO2 or another suitable material such as silicon oxynitride (SiOxNy). The interfacial layer may have a width or horizontal thickness (in direction Y) ranging from 0.5 nm to 1.5 nm.

ILD 608 may be formed surrounding and in contact with the gate stack of the upper VTFET. The ILD 608 may be formed of similar materials as that described above with respect to the ILD 130 of the lower VTFET. The top spacer 610 for the upper VTFET may be is formed over and in contact with the gate stack and ILD 608 surrounding and contacting portions of sidewalls of the upper vertical fin 108. The top spacer 610 may be formed of similar materials as the bottom spacer 602. The top spacer 610 may have a height or vertical thickness in the range of 10 to 30 nm, although other dimensions are applicable as well.

The top source/drain region 612 may either be a source layer or a drain layer and formed over and in contact with the top surfaces of the upper vertical fin 108. The top source/drain region 612 may be formed of similar materials and using similar processing as that discussed above with respect to the bottom source/drain region 116. The top source/drain region 612 may have a height or vertical thickness in the range of 10 to 30 nm and may have a width or horizontal thickness in the range of 10 to 30 nm, although other dimensions are applicable as well. The additional ILD 614 may be formed surrounding and in contact with the top source/drain region 612 and the top spacer 610. The additional ILD 614 may be formed of similar materials as those described above with respect to the ILD 130. The additional ILD 614 may overfill the structure, and may have a height or vertical thickness that exceeds the top surface of the top source/drain region 612, such as a height or vertical thickness in the range of 30 to 70 nm although other dimensions are applicable as well.

Figure 7:
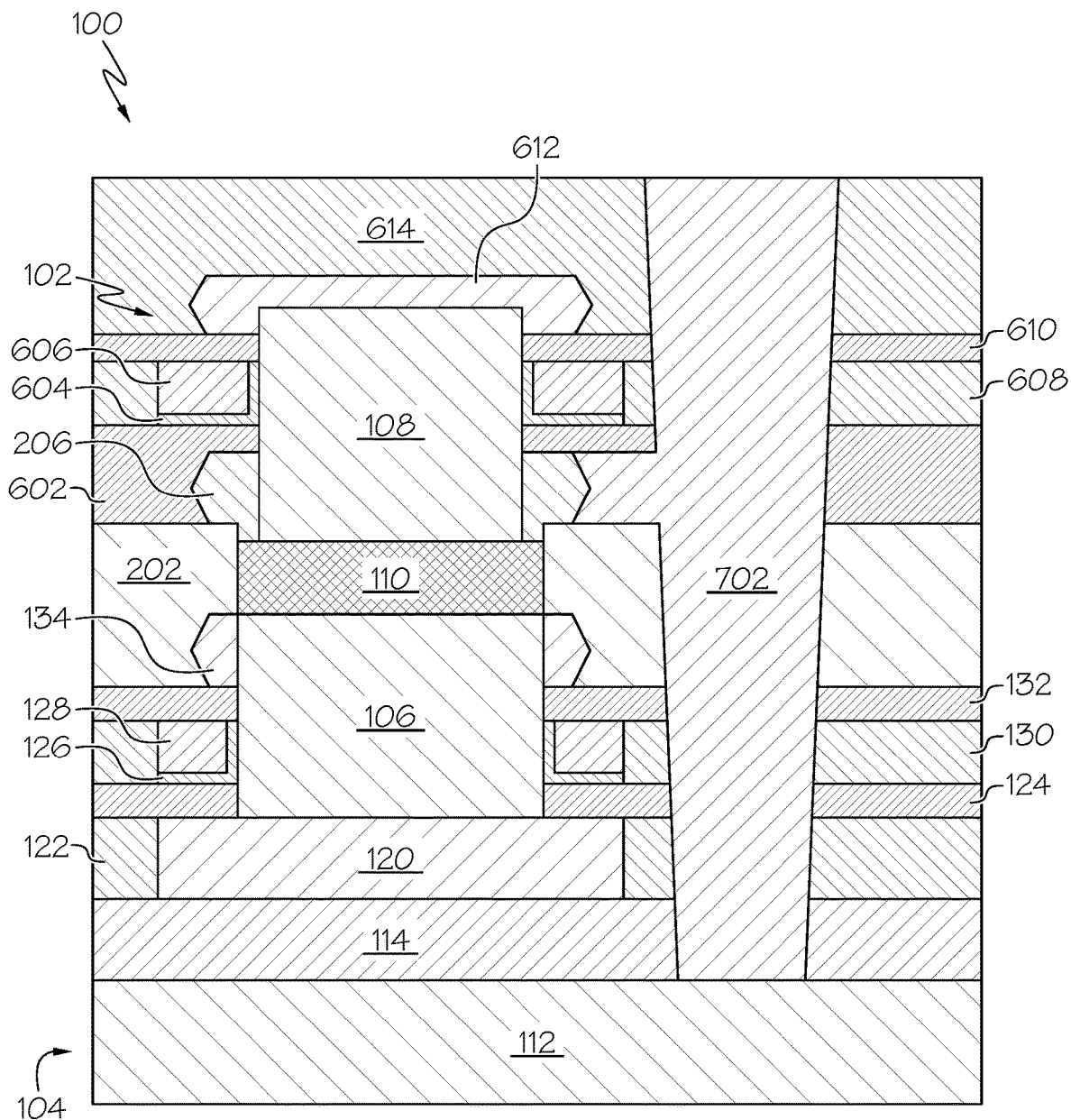
FIG. 7 is a cross-sectional view of the semiconductor device structure after the sacrificial has been removed and a metal contact has been formed in contact with the substrate and the bottom source/drain region of the upper VTFET according to one embodiment of the present invention.

FIG. 7 is a cross-sectional view of the structure of FIG. 6 after the sacrificial layer 502 has been removed and a metal contact 702 has been formed. For example, a mask layer may be patterned over the top surface of the additional ILD 614, exposing portions of the additional ILD 614 corresponding to portions of sacrificial layer 502. An etching process such as RIE or other suitable processing may be performed to remove exposed portions of the additional ILD 614, top spacer 610, ILD layer 202, and sacrificial layer 502. For example, a channel may be formed by the RIE process that exposes the sacrificial layer 502. The sacrificial layer 502 may then be removed using an etch process that removes the sacrificial material of these layers selective to the remaining materials/layers.

As a result, a cavity is formed that exposes portions of the upper VTFET bottom source/drain region 206. In some embodiments, for example, the remaining layers/materials may be formed of nitride-based materials or other materials, while the sacrificial material of the sacrificial layer 502 may be an oxide-based material. In such cases, the etch used to remove the sacrificial layer 502 may be a selective wet etch, a non-directional dry etch, or other similar etches that may etch oxide-based materials selective to other materials such as nitride-based materials. It should be noted that a sacrificial layer formed in contact with the top source/drain region 612 of the upper VTFET, the top source/drain region 134 of the lower VTFET, or the bottom source/drain 120 of the lower VTFET may be similarly removed as discussed in U.S. patent application Ser. No. 16/360,353, entitled "Stacked Vertical Field-Effect Transistors With Sacrificial Layer Patterning", which is hereby incorporated by reference in its entirety.

The channels/cavities may then be filled with a contact material to form the contact 702, which will become the Vdd power line for the device. The contact material may be tungsten (W), cobalt (Co), or another suitable material. In some embodiments, any overburden contact material may be planarized down to the upper surface of additional ILD layer 614. As shown in FIG. 7, for example, contact material is filled onto the vertical and horizontal channels/cavities to form a metal contact 702 for the upper VTFET bottom source/drain region 206. Front-side metal contacts (not shown) for the remaining source/drain regions 120, 134, 612 may similarly formed where applicable. It should be noted that in another embodiment the contact 702 may formed after the flipping/rotating process discussed below.

Figure 8:
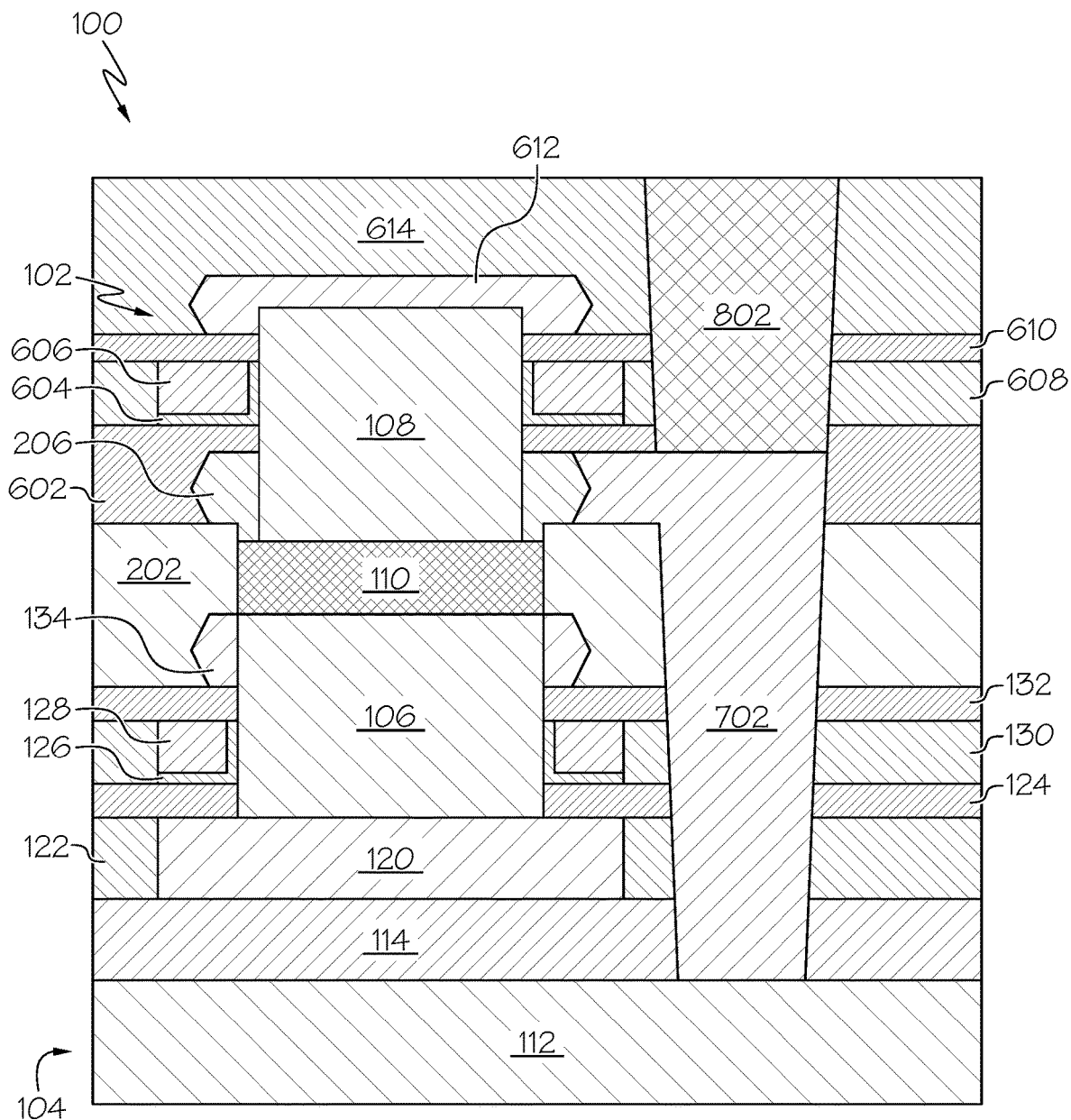
FIG. 8 is a cross-sectional view of the semiconductor device structure after a portion of the metal contact has been recessed and a backfill has been deposited according to one embodiment of the present invention.

FIG. 8 shows a cross-sectional view of the structure of FIG. 7 after the metal contact 702 has been 13 recessed down. In some embodiments, the metal contact 702 is recessed down to at least the bottom spacer 602 of the upper VTFET although the recessing may stop before this point in other embodiments. The metal contact 702 may be etched using a wet etching or other applicable process. Additional ILD material 802 may then be deposited within the cavity/trench created by recessing the bottom spacer 602. Excess ILD may be removed by such that a top surface of the ILD material 802 and a top surface of the ILD 614 are co-planar. After the ILD material 802 has been planarized, additional processing may be performed to complete additional metal interconnections at the front end of the device.

Figure 9:
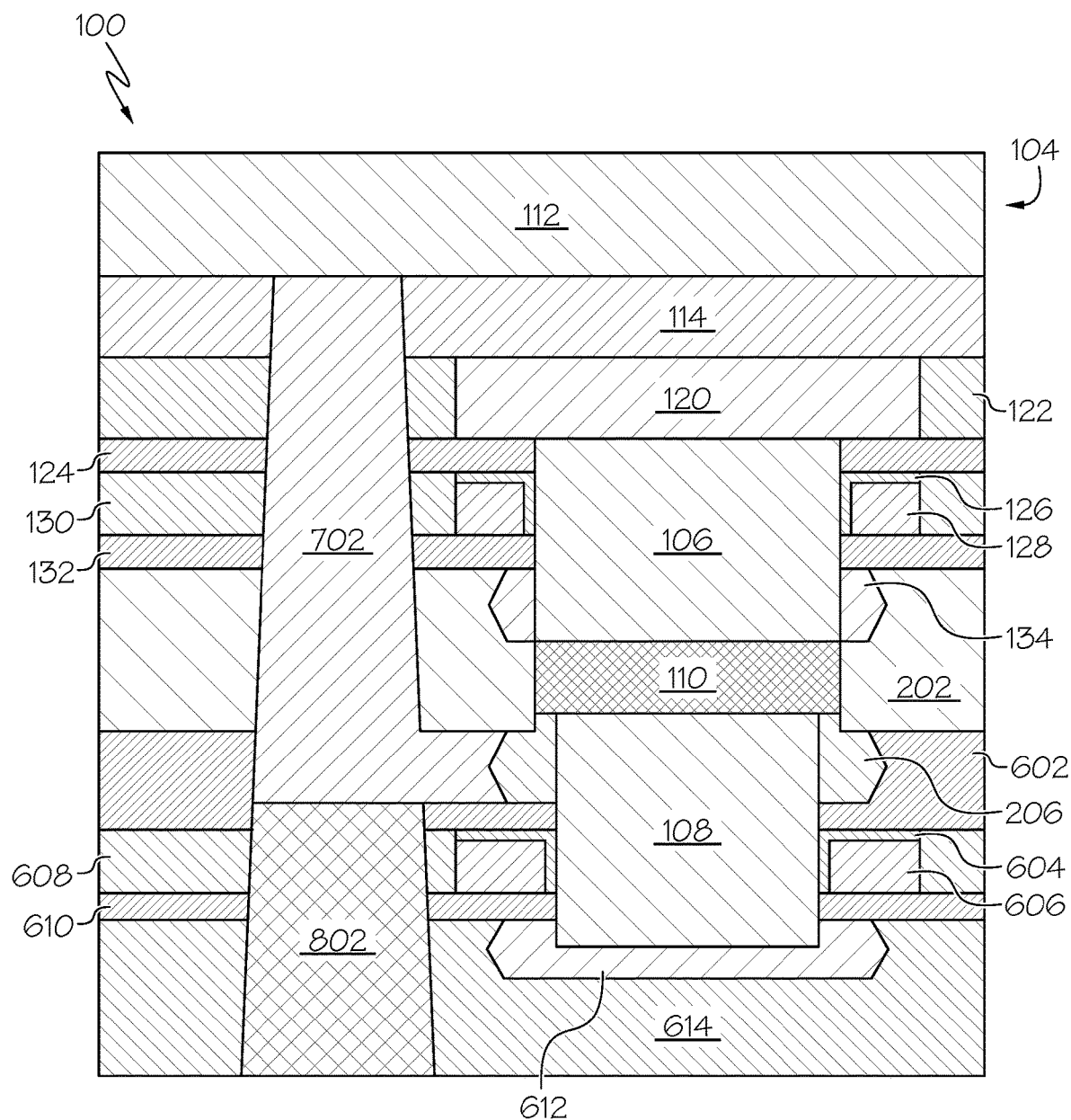
FIG. 9 is a cross-sectional view of the semiconductor device structure after the structure has been orientated such that the substrate is above the upper and lower VTFETs according to one embodiment of the present invention.
Figure 10:
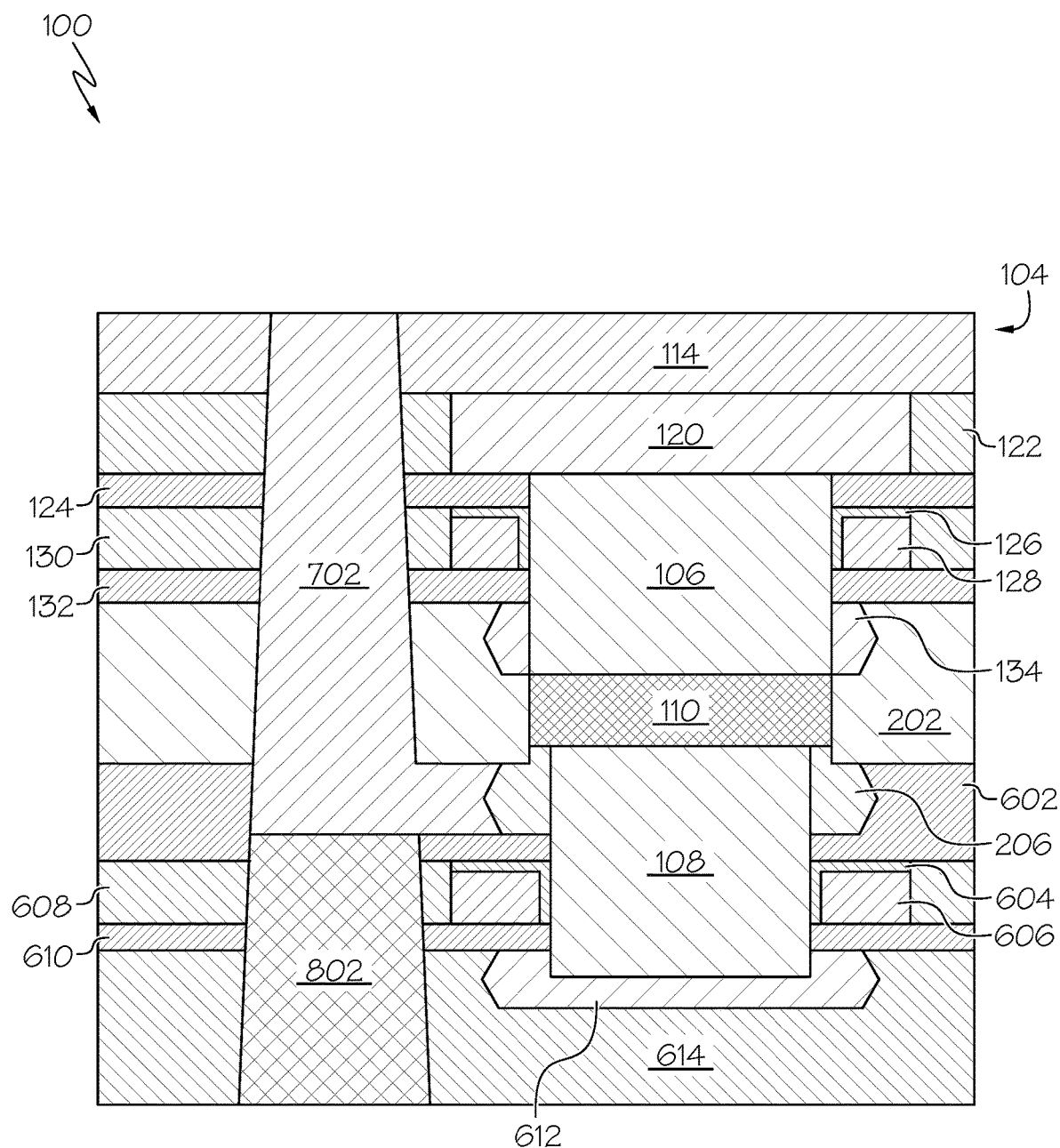
FIG. 10 is a cross-sectional view of the semiconductor device structure after a first layer of the substrate has been removed according to one embodiment of the present invention.
Figure 11:
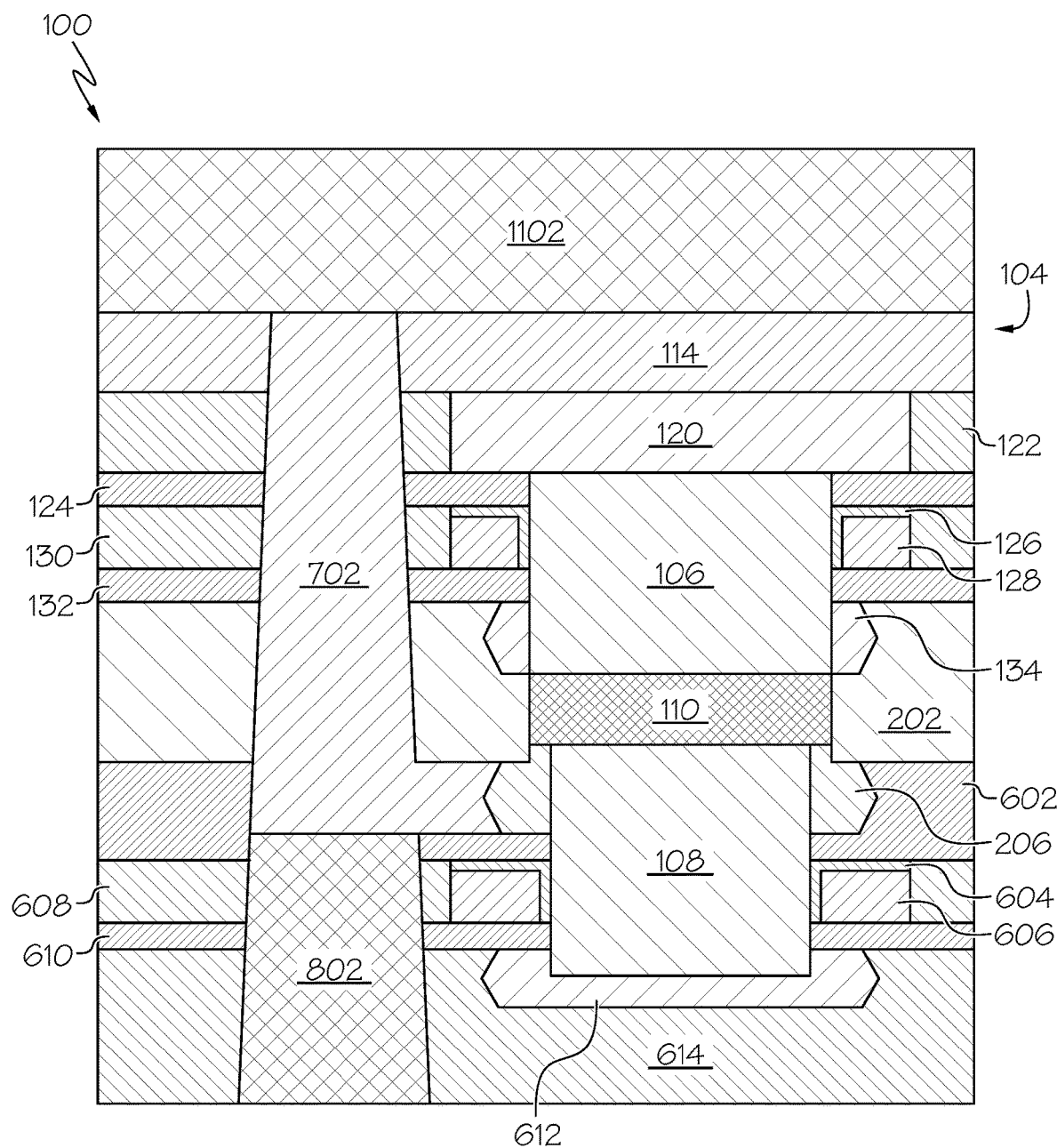
FIG. 11 is a cross-sectional view of the semiconductor device structure after an interlayer dielectric has been formed according to one embodiment of the present invention.

FIG. 9 is a cross-sectional view of the structure 100 shown in FIG. 8 after the structure 100 has been orientated (e.g., rotated, flipped, and/or the like) such that the substrate 104 is now orientated at the top and the dielectric layer 614 is orientated at the bottom. Stated differently, the backside of the device is now oriented at the top. After the structure 100 has been orientated a CMP process is performed to remove the substrate 104 to expose the BOX layer 114, as shown in FIGS. 10 and 10A. An additional ILD 1102 may then be deposited on and in contact with the exposed BOX layer 114, as shown in FIG. 11.

Figure 12:
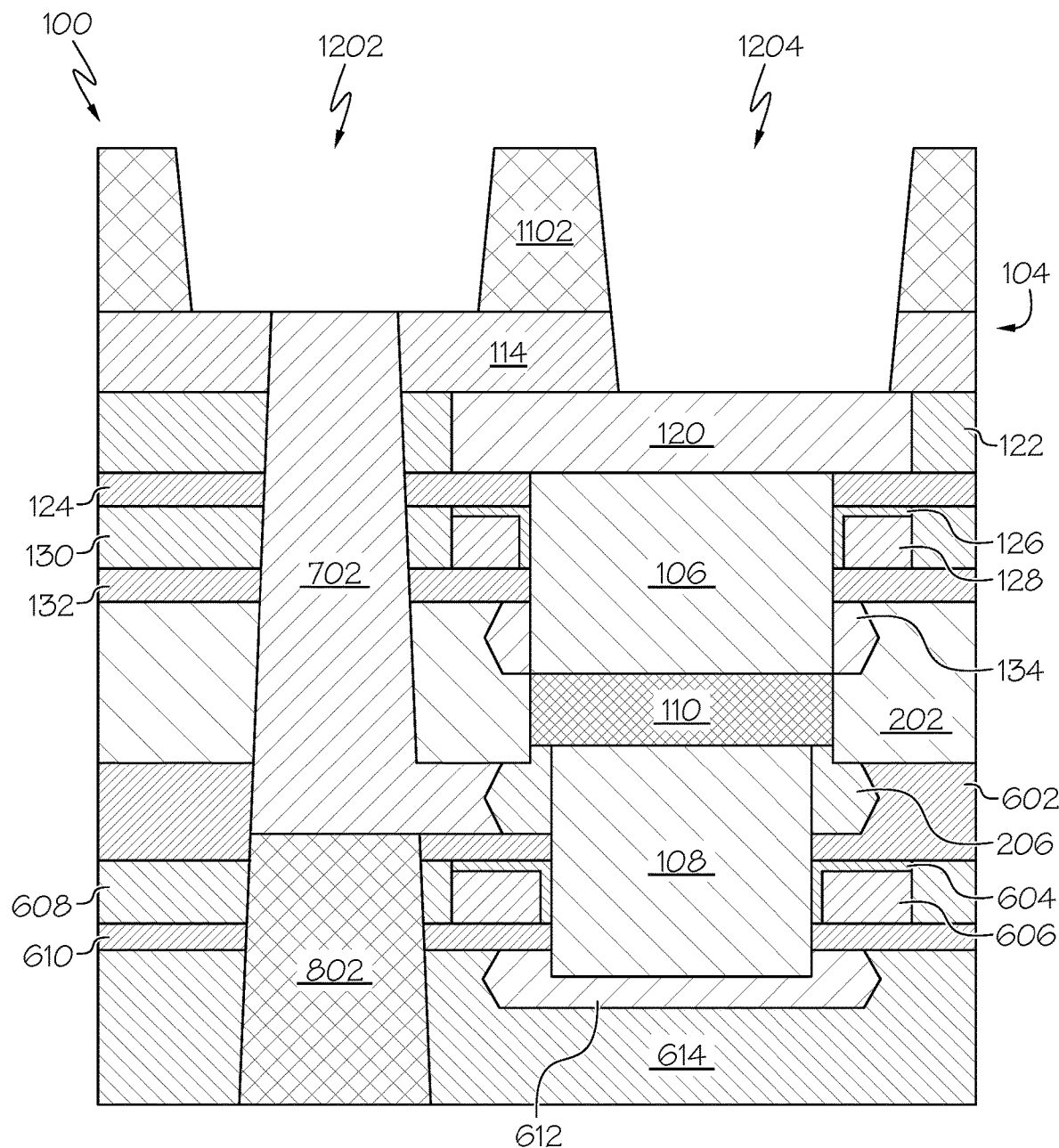
FIG. 12 is a cross-sectional view of the semiconductor device structure after a first contact trench has been formed in the interlayer dielectric exposing a portion of the metal contact and a second contact trench has been formed exposing a portion of the bottom source/drain region of the lower VTFET according to one embodiment of the present invention.

FIG. 12 is a cross-section view of the structure 100 after one or more contact trenches 1202, 1204 have been formed. A first contact trench 1202 exposes a portion of the metal contact 702 that extends beyond the source/drain region 120, and further exposes a portion of the BOX layer 110. The second contact trench 1204 exposes a portion of the source/drain region 120 and inner sidewalls of BOX layer 110. The contact trenches 1202, 1204 may be formed by forming a lithographic patterning stack over the BOX layer 110 and performing one or more lithographic techniques to pattern the stack as desired. In one embodiment, stack is patterned such that areas of the BOX layer 110 corresponding to the first and second contact trenches 1202, 1204 are exposed. One or more etching processes may then be performed to form the contact trenches 1202, 1204. In one embodiment, the etching of the first contact trench 1202 stops on the metal contact 702 and BOX layer 110 whereas the etching of the second contact trench 1204 etches through the BOX layer 110 and stops on the source/drain region 120.

Figure 13:
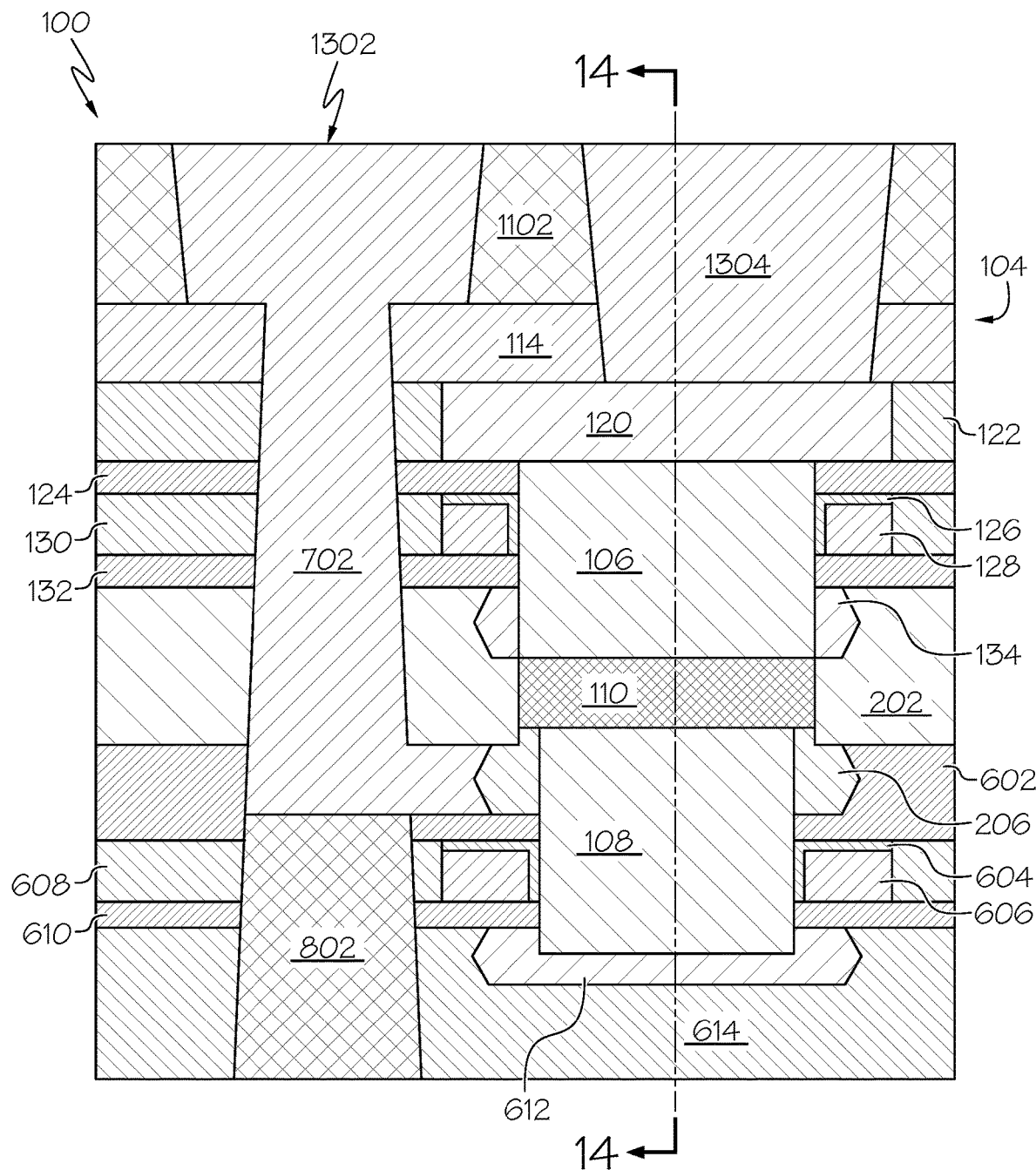
FIG. 13 is a cross-sectional view of the semiconductor device structure after a contact material has been deposited within the first and second contact trenches thereby forming buried power and ground lines in the backside of the semiconductor device structure according to one embodiment of the present invention.
Figure 14:
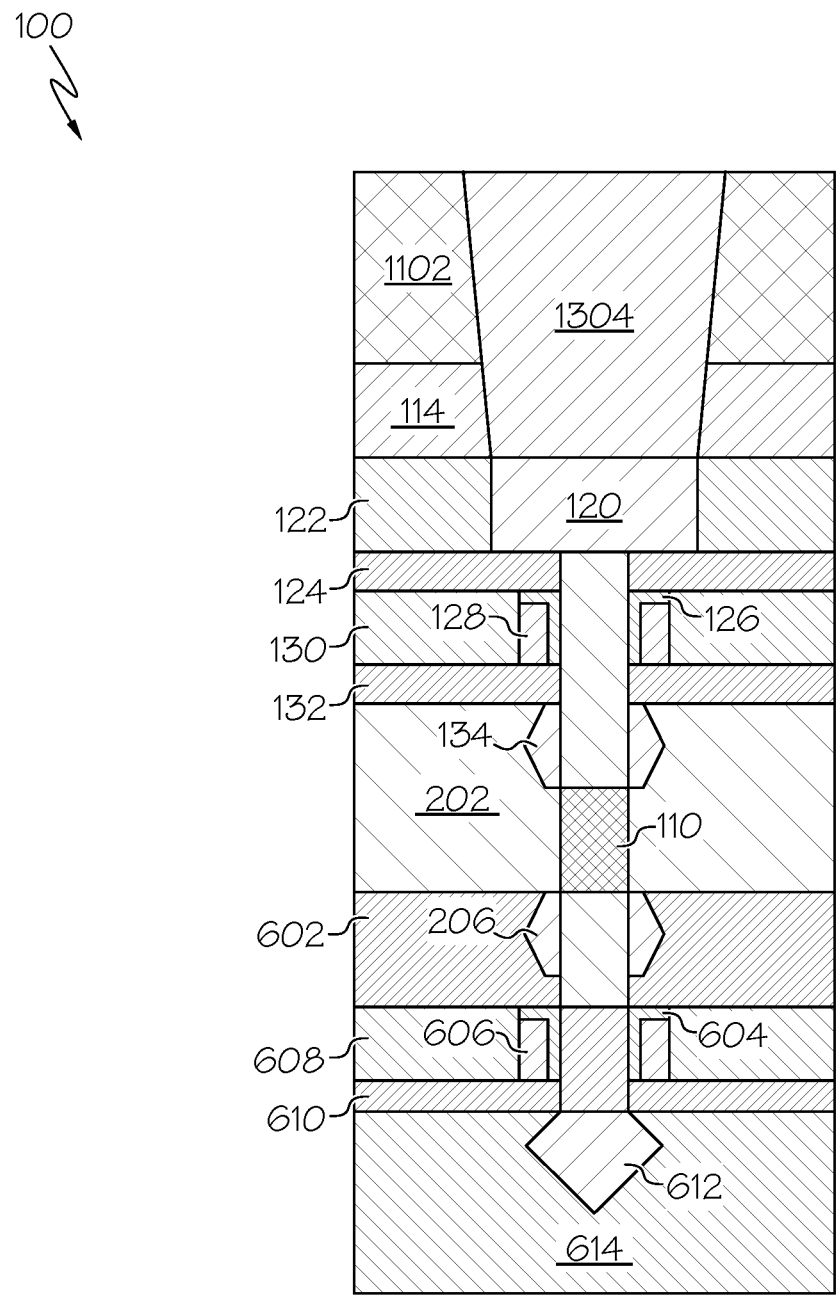
FIG. 14 is a cross-sectional view of the semiconductor device structure of FIG. 13 taken perpendicular to the stacked VTFET structure according to one embodiment of the present invention.

FIGS. 13 and 14 are cross-sectional views of the structure 100 after the contact trenches 1202, 1204 have been filled with a contact material. The contact material deposited into the first contact trench 1202 fills the trench 1202 and contacts the exposed portion of the metal contact 702 to form a buried Vdd power line 1302. The contact material deposited into the second contact trench 1204 fills the trench and contacts the exposed portions of the source/drain 120 to form a buried ground (GND) line 1304 for the device. The contact material may be tungsten (W), cobalt (Co), or another suitable material. In some embodiments, any overburden contact material may be planarized down to the surface of the BOX layer 110. The resulting structure comprises a Vdd power line 1302 and a GND line 1304 formed in the backside of the device. Processing may continue form the remaining power/ground grid. For example, the Vdd power line 1302 and a GND line 1304 may be respectively coupled to subsequently formed power and ground rails. Then, the entire power delivery grid, which may comprise at least two metal levels with lines running perpendicular to each other, may be formed on top of the power and ground rails.

Figure 15:
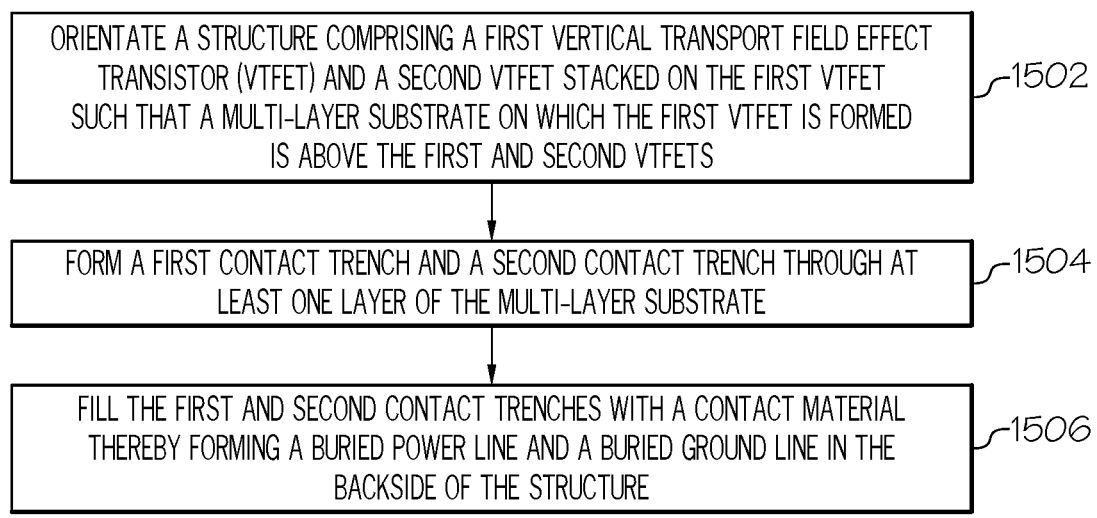
FIG. 15 is an operational flow diagram illustrating one example of a process for forming a stacked VTFET structure according to one embodiment of the present invention.

FIG. 15 is an operational flow diagram illustrating one example of a process for forming a stacked VTFET structure according to one embodiment of the present invention. It should be noted that the process/operations shown in FIG. 14 have been discussed in detail with respect to FIGS. 1-14. A structure comprising a first vertical transport field effect transistor (VTFET) and a second VTFET stacked on the first VTFET, at step 1502, is orientated such that a multi-layer substrate on which the first VTFET is formed is above the first and second VTFETs. A first contact trench and a second contact trench, at step 1504, are formed through at least one layer of the multi-layer substrate. The first contact trench exposes a portion of a metal contact that is in contact with a source/drain region of one of the first VTFET or the second VTFET. The second contact trench exposes a portion of a source/drain region of a different one of the first VTFET or the second VTFET. The first and second contact trenches, at step 1506, are filled with a contact material.

Although specific embodiments have been taught, those having ordinary skill in the art will understand that changes can be made to the specific embodiments without departing from the spirit and scope of the invention. The scope of the invention is not to be restricted, therefore, to the specific embodiments, and it is intended that the appended claims cover any and all such applications, modifications, and embodiments within the scope of the present invention.

It should be noted that some features of the present invention may be used in one embodiment thereof without use of other features of the present invention. As such, the foregoing description should be considered as merely illustrative of the principles, teachings, examples, and exemplary embodiments of the present invention, and not a limitation thereof.

Also note that these embodiments are only examples of the many advantageous uses of the innovative teachings herein. In general, statements made in the specification of the present application do not necessarily limit any of the various claimed embodiments. Moreover, some statements may apply to some inventive features but not to others.

What is claimed is:

1. A method for forming a semiconductor device structure, the method comprising at least:

orientating a structure comprising a first vertical transport field effect transistor (VTFET) and a second VTFET stacked on the first VTFET such that a multi-layer substrate, on which the first VTFET is formed, is above the first and second VTFETs;

forming a first contact trench and a second contact trench through at least one layer of the multi-layer substrate, the first contact trench exposing a portion of a metal contact that is in contact with a source/drain region of the second VTFET, and the second contact trench exposing a portion of a source/drain region of the first VTFET; and filling the first and second contact trenches with a contact material.

2. The method of claim 1, wherein prior to orientating the structure, the method comprises:

forming a third contact trench through a plurality of layers of the structure thereby exposing a sacrificial layer formed in contact with the source/drain region of the second VTFET;

removing the sacrificial layer thereby forming a fourth contact trench that exposes a portion of the source/drain region of the the second VTFET; and filling the third contact trench and the fourth contact trench with a contact material.

3. The method of claim 1, wherein prior to orientating the structure, the method further comprises:

recessing the contact material within the first contact trench thereby forming an opening within the first contact trench; and depositing a fill material within the opening of the first contact trench.

4. The method of claim 1, wherein the one of the source/drain region of the one of the first VTFET or the second VTFET is one of a top source/drain region or a bottom source/drain region of the first VTFET.

5. The method of claim 1, wherein the one of the source/drain region of the one of the first VTFET or the second VTFET is one of a top source/drain region or a bottom source/drain region of the second VTFET.

6. The method of claim 1, wherein forming the first contact trench and the second contact trench comprises:

removing a substrate layer of the multi-layer substrate thereby exposing a buried oxide layer of the multi-layer substrate;

forming an interlayer dielectric layer on and in contact with the buried oxide layer;

etching down into the interlayer dielectric layer to form the first contact trench; and etching down into the interlayer dielectric layer and the buried oxide layer to form the second contact trench.

7. The method of claim 1 further comprising forming the structure, wherein forming the structure comprises:

forming an insulating layer on a semiconductor layer of the multi-layer substrate;

forming an additional semiconductor layer on the insulating layer;

patterning the semiconductor layer into a first semiconductor fin for the first VTFET;

patterning the additional semiconductor layer into a second semiconductor fin for the second VTFET, wherein the second semiconductor fin is stacked on the first semiconductor fin; and patterning the insulating layer into a patterned insulating layer disposed between the first semiconductor fin and the second semiconductor fin.

8. The method of claim 7 further comprising forming the first VTFET, wherein forming the first VTFET comprises:
   forming a bottom source/drain layer in contact with at least a lower portion of the first semiconductor fin;
   forming a bottom spacer in contact with a top surface of the bottom source/drain layer and further in contact with the first semiconductor fin;
   forming a gate structure in contact with a top surface of the bottom spacer and further in contact with the first semiconductor fin;
   forming a top spacer in contact with a top surface of the gate structure and further in contact with the first semiconductor fin; and
   forming a top source/drain layer in contact with a top surface of the top spacer and further in contact with the first semiconductor fin.

9. The method of claim 8 further comprising forming the second VTFET, wherein forming the second VTFET comprises:
   forming a bottom source/drain layer in contact with at least a lower portion of the second semiconductor fin;
   forming a bottom spacer in contact with a top surface of the bottom source/drain layer and further in contact with the second semiconductor fin;
   forming a gate structure in contact with a top surface of the bottom spacer and further in contact with the second semiconductor fin;
   forming a top spacer in contact with a top surface of the gate structure and further in contact with the second semiconductor fin; and
   forming a top source/drain layer in contact with a top surface of the top spacer and further in contact with the second semiconductor fin.

10. The method of claim 9, further comprising:
    after one of the bottom source/drain layer of the first VTFET, the top source/drain layer of the first VTFET or the bottom source/drain layer of the second VTFET has been formed, forming a sacrificial layer in contact therewith.

11. A stacked semiconductor device structure comprising at least:
    a first vertical transport field effect transistor (VTFET);
    a second VTFET stacked on the first VTFET; and
    at least one power line and at least one ground line disposed within a backside of the stacked semiconductor device structure.

12. The stacked semiconductor device structure of claim 11, wherein the at least one power line contacts a source/drain of the first VTFET and extends through a substrate on which the first VTFET is formed.

13. The stacked semiconductor device structure of claim 11, wherein the at least one ground line contacts a source/drain of the second VTFET and extends through a substrate on which the first VTFET is formed.

14. The stacked semiconductor device structure of claim 11, wherein the first VTFET comprises:
    a first semiconductor fin;
    a first bottom source/drain layer in contact with at least a lower portion of the first semiconductor fin;
    a first bottom spacer in contact with a top surface of the first bottom source/drain layer and further in contact with the first semiconductor fin;
    a first gate structure in contact with a top surface of the first bottom spacer and further in contact with the first semiconductor fin;
    a first top spacer in contact with a top surface of the first gate structure and further in contact with the first semiconductor fin; and
    a first top source/drain layer in contact with a top surface of the first top spacer and further in contact with the first semiconductor fin.

15. The stacked semiconductor device structure of claim 11, wherein the second VTFET comprises:
    a second semiconductor fin;
    a second bottom source/drain layer in contact with at least a lower portion of the second semiconductor fin;
    a second bottom spacer in contact with a top surface of the second bottom source/drain layer and further in contact with the second semiconductor fin;
    a second gate structure in contact with a top surface of the second bottom spacer and further in contact with the second semiconductor fin;
    a second top spacer in contact with a top surface of the second gate structure and further in contact with the second semiconductor fin; and
    a second top source/drain layer in contact with a top surface of the second top spacer and further in contact with the second semiconductor fin.

16. The stacked semiconductor device structure of claim 11, wherein the at least one power line and at least one ground line are respectively coupled to a power rail and a ground rail, and wherein a power delivery grid is formed on top of the power rail and the ground rail, where the power delivery grid comprises at least two metal levels with lines running perpendicular to each other.

17. An integrated circuit comprising:
    a stacked vertical transport field effect transistor (VTFET) device, wherein the stacked VTFET device comprises a first vertical transport field effect transistor (VTFET);
    a second VTFET stacked on the first VTFET; and
    at least one power line and at least one ground line disposed within a backside of the stacked VTFET device
    wherein the at least one power line contacts a source/drain of the first VTFET and extends through a substrate on which the first VTFET is formed, and
    wherein the at least one ground line contacts a source/drain of the second VTFET and extends through the substrate.

18. The integrated circuit of claim 17, wherein the first VTFET comprises:
    a first semiconductor fin;
    a first bottom source/drain layer in contact with at least a lower portion of the first semiconductor fin;
    a first bottom spacer in contact with a top surface of the first bottom source/drain layer and further in contact with the first semiconductor fin;
    a first gate structure in contact with a top surface of the first bottom spacer and further in contact with the first semiconductor fin;
    a first top spacer in contact with a top surface of the first gate structure and further in contact with the first semiconductor fin; and
    a first top source/drain layer in contact with a top surface of the first top spacer and further in contact with the first semiconductor fin.

19. The integrated circuit of claim 18, wherein the second VTFET comprises:
    a second semiconductor fin;
    a second bottom source/drain layer in contact with at least a lower portion of the second semiconductor fin;

a second bottom spacer in contact with a top surface of the second bottom source/drain layer and further in contact with the second semiconductor fin;
a second gate structure in contact with a top surface of the second bottom spacer and further in contact with the second semiconductor fin;
a second top spacer in contact with a top surface of the second gate structure and further in contact with the second semiconductor fin; and
a second top source/drain layer in contact with a top surface of the second top spacer and further in contact with the second semiconductor fin.

\* \* \* \* \*